(12) United States Patent
Garbuzov et al.

(10) Patent No.: US 6,301,279 B1
(45) Date of Patent: Oct. 9, 2001

(54) SEMICONDUCTOR DIODE LASERS WITH THERMAL SENSOR CONTROL OF THE ACTIVE REGION TEMPERATURE

(75) Inventors: Dmitri Zalmanovich Garbuzov, Princeton, NJ (US); Mikhail Alexandrovich Maiorov, Levittown, PA (US); Viktor Borisovich Khalfin, Princeton; John Charles Connolly, Clarksburg, both of NJ (US)

(73) Assignee: Princeton Lightwave Inc., Cranbury, NJ (US)

( * ) Notice: Subject to any disclaimer, the term of this patent is extended or adjusted under 35 U.S.C. 154(b) by 0 days.

(21) Appl. No.: 09/430,643

(22) Filed: Oct. 29, 1999

Related U.S. Application Data

(60) Provisional application No. 60/129,810, filed on Apr. 16, 1999.

(51) Int. Cl.[7] .................................................. H01S 3/04

(52) U.S. Cl. .................................................. 372/36; 372/34
(58) Field of Search .......................................... 372/36, 34

(56) References Cited

U.S. PATENT DOCUMENTS 5,568,502 * 10/1996 Hironaka ................................. 372/50
5,875,204 * 2/1999 Sato ....................................... 372/34
6,033,929 * 3/2000 Murakami et al. ..................... 438/46

* cited by examiner

*Primary Examiner*—Teresa M. Arroyo
*Assistant Examiner*—Davienne Monbleau
(74) *Attorney, Agent, or Firm*—Arthur L. Plevy; Duane Morris

(57) ABSTRACT

A semiconductor diode laser with thermal sensor control comprises a heat sink, a diode-laser structure, and a thermal sensor thermally coupled to said diode-laser structure in a place where the temperature gradient across the semiconductor diode laser is close to zero.

14 Claims, 2 Drawing Sheets

SEMICONDUCTOR DIODE LASERS WITH THERMAL SENSOR CONTROL OF THE ACTIVE REGION TEMPERATURE

RELATED APPLICATIONS

This application claims the benefit of U.S. Provisional application Serial No. 60/129,810, filed Apr. 16, 1999.

GOVERNMENT SUPPORT

This invention was at least partially supported by the Government Contract No. N66001-96-C-8630. The government may have certain rights in this invention.

FIELD OF THE INVENTION

The present invention relates to semiconductor diode lasers. In particular, the present invention relates to semiconductor diode lasers that use a thermal sensor to provide temperature feedback to maximize power-conversion efficiency.

BACKGROUND

Temperature control in a diode laser is important for several reasons. First, temperature control is important because a change in temperature can strongly and adversely effect a laser's power output. For example, a diode laser's power output can be increased by increasing the bias current across the diode laser, but this approach is limited because the increase in current will lead to an increase in the diode laser's temperature. Typically, at least half of the electrical power applied to bias a laser will be lost as heat within the diode. This in turn leads to an increase in the threshold current necessary for sustaining laser oscillation. As a result, the relationship between the bias current and output power becomes nonlinear as the bias current is increased, and ultimately will saturate at a high bias-current level. This is the so-called "rollover" effect; as the bias current is increased, the temperature in the active region increases, and so the power output begins to drop off.

Second, temperature control is important because temperature is related to the output spectrum. Overheating the active region can lead to both a shift of and a broadening of the emitted spectrum. Thus, the ability to control the output spectrum, and consequently, the ability to use the resulting output spectrum, decreases as the active region increases in temperature.

To reduce temperature-related problems in a diode laser, known thermal stabilization systems have been designed to operate with the diode lasers. These thermal stabilization systems include a thermal sensor adjacent to the laser heat sink to provide a feedback signal, and a thermo-electric cooler also adjacent to the laser heat sink where the sensor is fixed. Such thermal stabilization systems are able to support the relatively stable active region temperature under conditions of variable ambient temperature.

Said another way, known thermal stabilization systems have thermal sensors adjacent to the heat sink. These thermal sensors help stabilize the temperature of the heat sink at the spot where the sensor is mounted. In these known thermal stabilization systems, thermal sensors are placed at the heat sink because this is the simplest geometry, and it was generally believed that this was the only possible way to use the thermal sensors. Additionally, those skilled in the known art did not think that the temperature gradient between the thermal sensor and the laser body was substantial enough to degrade performance. For example, it is generally known in the art to use sensors that are not removable. The sensors are fixed in the copper part of the laser fixture adjacent to a laser heat sink. It was generally believed that this was the only possible way to measure the temperature in the laser.

SUMMARY OF THE INVENTION

The present invention is based on a recent discovery by the inventors. Specifically, the inventors recently discovered that the temperature gradient between the sensor and the laser body was so large as to degrade performance unnecessarily. Even worse, the inventors discovered that the temperature gradient between the heat sink and the active region increases non linearly with current. This non-linear increase in the temperature gradient causes feedback control to be suboptimal with regard to stabilizing the temperature in the active region.

To alleviate the problems that the inventors have recognized in the known systems, the present invention introduces systems and methods for improving temperature control in a laser's active region. In one embodiment of the present invention, a semiconductor diode laser with a thermal sensor control comprises a heat sink, a diode-laser structure including an active layer, and a thermal sensor thermally coupled to said diode-laser structure. In this embodiment, the heat sink is separated from the thermal sensor by a first distance, and the heat sink is separated from the active layer by a second distane that is less than the first distance.

DETAILED DESCRIPTION

The present invention is directed towards systems and methods for stabilizing temperature in a laser. As discussed above, known systems have used a configuration in which the thermal sensor was placed at or near the heat sink. This configuration was thought to be the only configuration practicable, but it was not generally recognized that this configuration was suboptimal; those skilled in the art did not understand the nature of the temperature gradient with respect to the bias current, and so did not understand how to stabilize temperature in the active region in an optimal way. Additionally, it was thought that if the thermal sensor were moved closer to the active region, or on to the laser body, the signal from the thermal sensor, and therefore the feedback control of the temperature, would be degraded due to cross talk between the bias current and the thermal sensor's signal. Finally, in older systems, the relative sizes of known thermal sensors are much larger than the typical chip size, which limited thermal-sensor placement.

With the advent of new technology, however, and with the knowledge gained from the inventors' study of the temperature gradient across the heat sink and heterostructure, the present invention has been conceived and configured to improve laser output by providing better thermal-sensor control. The experiments that lead to the conclusion that there was a problem in the known systems, and that lead to the solution of that problem, are highlighted and discussed in D. Garbuzov, M. Maiorov, V. Khalfin, M. Harvey, A. Al-Muhanna, L. Mawst, D. Botez, and J. Connolly, *SPIE Photonics West Conference*>99, San Jose, Calif., 1999, pp. 3625–93, which is hereby incorporated by reference in its entirety. This paper shows that embodiments of the present invention not only work for their intended purposes, but is far superior in terms of temperature stabilization, and therefore power-output stabilization and spectral stabilization, than known systems.

Figure 1:
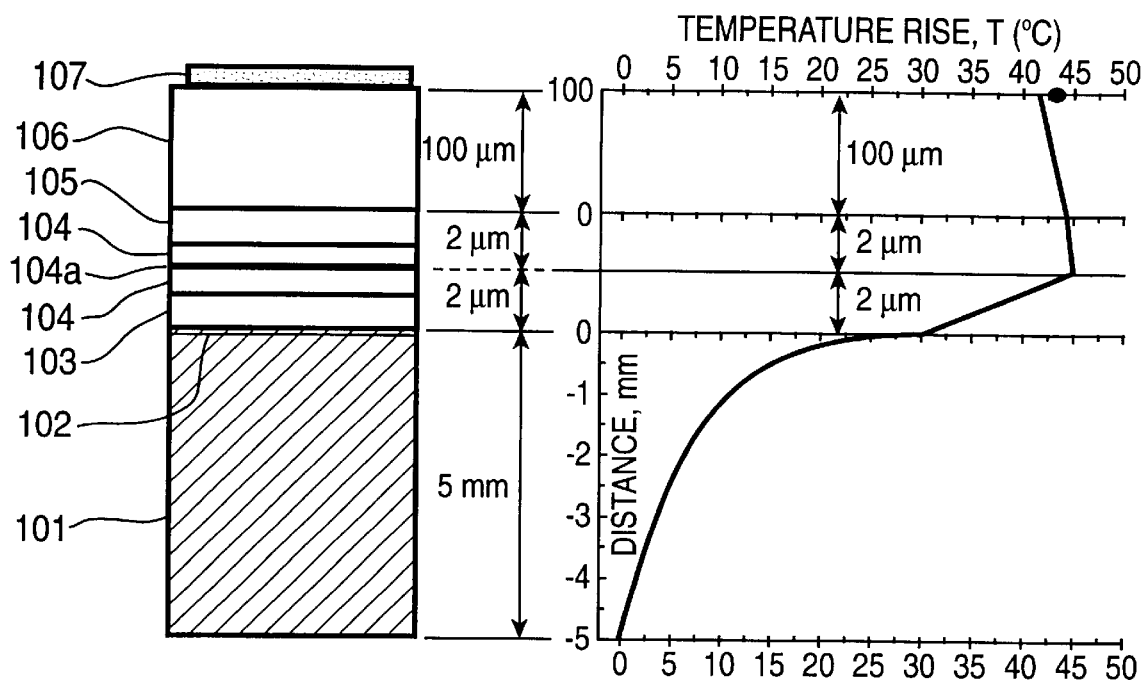
FIG. 1 is a schematic overview of a semiconductor diode laser along with a graphical representation of how temperature in the displayed structure varies throughout the structure.

FIG. 1 is shown to illustrate some of the work performed by the inventors that lead to embodiments of the present invention. FIG. 1 is a schematic overview of a semiconductor diode laser along with a graphical representation of how temperature in the displayed structure varies throughout the structure. In this figure, the thickness of various components is detailed, but these thicknesses are not meant to imply any limitation on the claimed invention. Rather, the thickness of the various components are placed in the diagram to better illustrate the temperature gradient at a constant current as a function of distance from the bottom of the diagram. It should be appreciated that embodiments of the invention can contain variations on the displayed thickness of each component shown in FIG. 1. In this figure, a heat sink 101 is shown having a thickness of 5 mm. The laser itself is placed on heat sink 101 (which can be referred to as a submount). The laser comprises first electrical contact 102 (which can be either a p or an n contact), first cladding layer 103, waveguide 104 (which contains active layer 104a), second cladding layer 105, substrate 106, and second electrical contact 107 (which should possess the opposite polarity of firs: electrical contact 102).

FIG. 1 also displays the calculated increase in temperature in the direction perpendicular to the heat sink plane at 15 W emitted optical power and 15 W dissipated power in the form of heat. For the results displayed in this figure, the specific thermal resistance of 20 cm ° C./W was used for $In_{0.5}Ga_{0.5}P$ and InGaAsP compounds as materials for cladding and waveguide layers in this device. As can be seen in FIG. 1, the temperature gradient across GaAs substrate 106 is very small; the difference in temperatures between the bulk of active region 104 and second electrical contact 107 does not exceed 4° C. even at 15 W of dissipated power. In contrast, the temperature distribution changes very abruptly near the submount (heat sink 101)/laser interface; the temperature changes by a factor of two at only 0.5 mm from the submount's surface. A comparable temperature gradient exists at the submount surface in the direction perpendicular to the laser cavity axis parallel to the heat sink surface. This result demonstrates that temperature control systems that use thermal sensors affixed at the heat sink surface cannot support constant temperature even at the submount device interface. In fact, in the case of high-power lasers, the active region temperature can be, for example, 50° C. higher than the temperature reading from the heat sink thermal sensor.

Thus, to allow for greater temperature control, embodiments of the present invention are designed such that the thermal sensor is placed on the portion of the laser body in which the temperature gradient toward the active region is relatively small.

Figure 2:
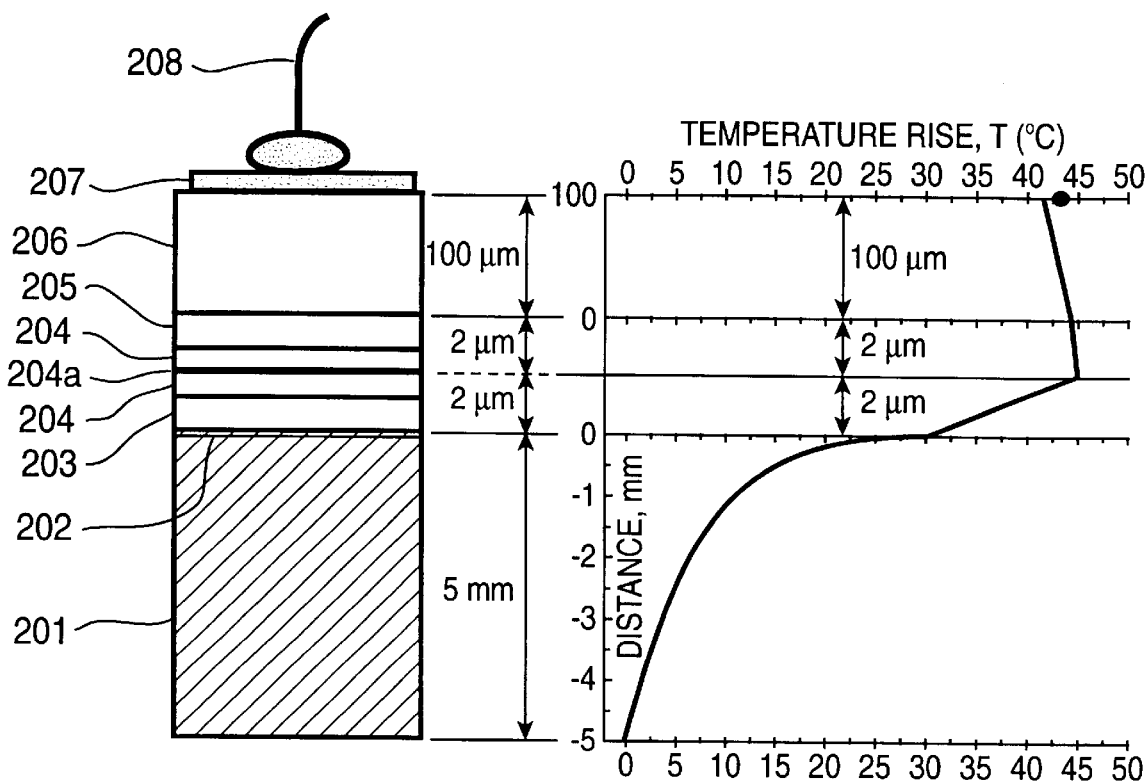
FIG. 2 is a schematic diagram of an embodiment of the present invention.

FIG. 2 is a schematic diagram of an embodiment of the present invention. Exemplary measurements are placed in the figure, but are not meant to limit the invention to those specific measurements. The invention can use any measurements that would be considered practicable by those skilled in or practicing the art. In the embodiment in this figure, a submount is heat sink 201. On top of heat sink 201 is a diode-laser structure that includes a substrate, and several epi-layers that include an active layer, all disposed between electrical contacts. Specifically, in FIG. 2 is shown first electrical contact 202 (which can be ; "p" or an "n" contact electrically coupled to the structure, first cladding layer 203, waveguide 204,(containing active region 204a) second cladding layer 205, substrate 206, second electrical contact 207 (which should be of the opposite polarity of first electrical contact 202), and finally thermal sensor 208.

The laser can be any type of diode laser comprising different combinations of epi-layers. For the purposes of the present invention, the term epi-layers refers to a series of layers deposited onto a substrate one on top of another. Typically, the laser chip will always consist of a substrate on which epi-layers (including the active region) are grown. Then, an electrical contact is deposited on both the top and bottom surfaces. After this, the wafer is cleaved and chipped, and then the chip is soldered into a heat sink. In one embodiment of the present invention, the chip can be mounted "substrate down"(on the heat sink). In this case, the thermal sensor will be placed on the epi-layer away from the heat sink.

Note that, although heat sink 201 is attached to the epi-layer side of the diode-laser structure in FIG. 2, in an alternate embodiment, heat sink 201 can be attached to the substrate side of the diode-laser structure as long as thermal sensor 208 is not thermally connected to the diode-laser structure on the epi-layer side of the diode-laser structure. Specifically, heat sink 201 and thermal sensor 208 should be placed such that heat sink 201 is separated from thermal sensor 208 by a first distance, heat sink 201 is separated from active layer 204a by a second distance, with the second distance being less than the first distance. In another embodiment of the present invention, heat sink 201 and thermal sensor 208 should be placed such that heat sink 201 is separated from substrate 207 by a first distance, heat sink 201 is separated from thermal sensor 108 by a second distance, with the second distance greater than the first distance.

In general, thermal sensor 208 should be placed where the temperature gradient of the laser structure is very small, and yet accurately reflects a temperature measurement in the active region. Additionally, using active layer 204a as a reference dividing line, thermal sensor 208 should be placed such that active layer 204a is closer to heat sink 201 than is thermal sensor 208. In the embodiment shown in FIG. 2, thermal sensor 208 is placed on second electrical contact 207. In another embodiment of the present invention, thermal sensor 208 can be in direct contact with substrate 206, that is, without any intervening components such as second electrical contact 207. In yet another embodiment of the present invention, the thermal sensor (e.g., thermal sensor 208) can be placed against the second cladding layer (e.g., second cladding layer 205).

Figure 3:
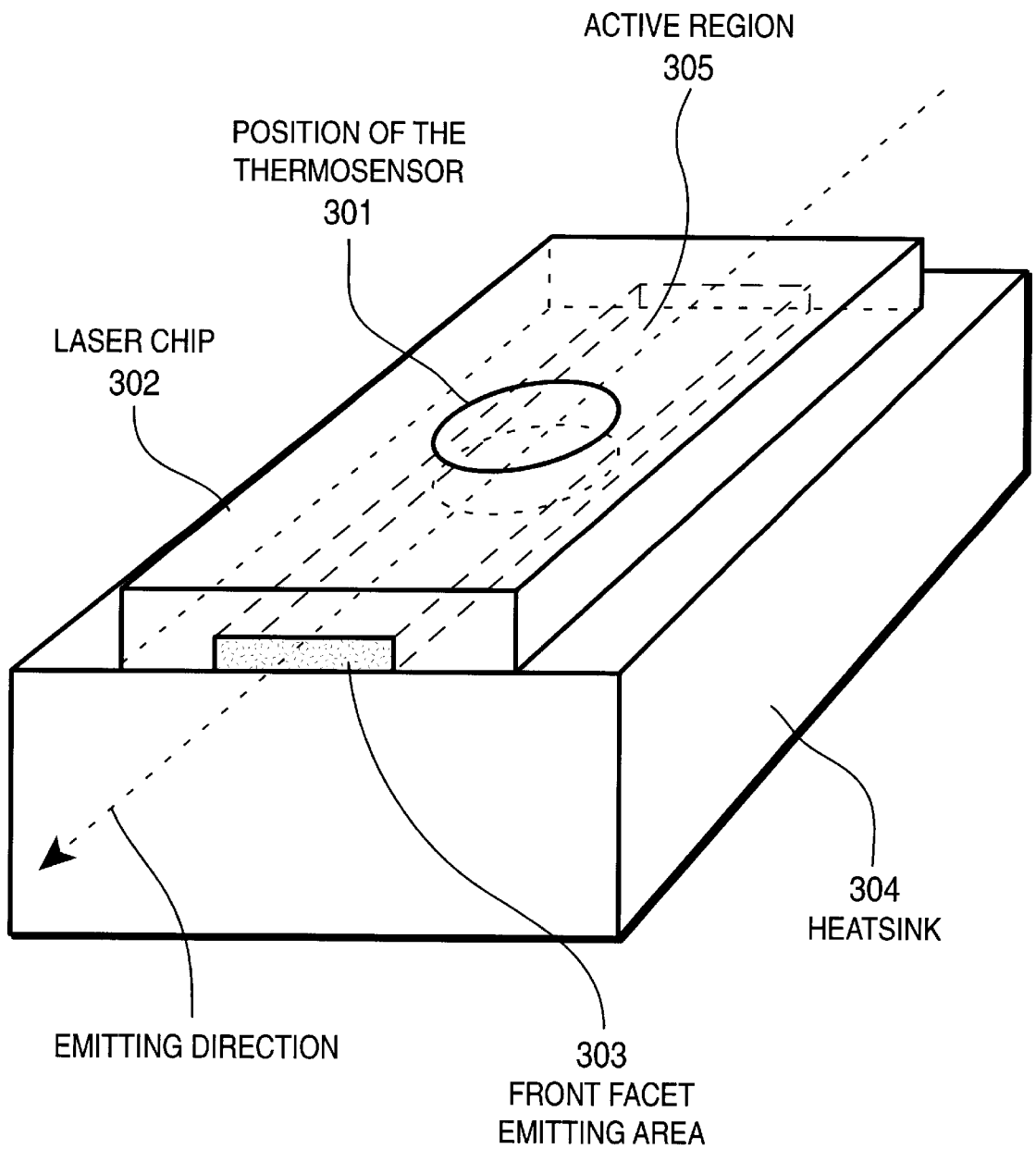
FIG. 3 is a diagram of a perspective view of an embodiment of the present invention.

FIG. 3 is a diagram of a perspective view of an embodiment of the present invention. In this embodiment, thermosensor 301 is positioned on top of laser chip 302. Laser chip 302 is placed in contact with heat sink 304 such that laser chip 302 is situated between thermosensor 301 and heat sink 304. In this diagram, light is emitted from front facet emitting area 303 in a direction substantial outward from the page.

The thermal sensor should be mounted on the laser at a position corresponding to the projection of active region 305. In other words, thermal sensor 301 should be mounted "over" active region 305 such that, if active region 305 were projected upward from its position in FIG. 3, it would extend to the position where thermal sensor 301 is placed (of course, the directions "upward" and "over" are arbitrary, and can be understood in the present context to encompass "downward" and "under," depending on the orientation of the device.) In one embodiment of the present invention, the thermal sensor head diameter is comparable with stripe width.

The thermal sensor can be any known thermal sensor suitable for use in the particular geometry. Additionally, the thermal sensor chosen should not be so sensitive to cross talk with the bias current that it renders the temperature control ineffective. For example, the thermal sensor made by Omega Engineering, Ltd., with a head and wire diameter of 50–125 microns, can be used for the direct temperature control of the top n-side contact of the laser diodes mounted p-episode down.

The improvements in the relationship between the bias current and output power with this new thermal stabilization approach are even more pronounced for lasers with longer wavelengths (e.g., a wavelength of 2.5 mm) because the laser parameter temperature sensitivity increases with wavelength.

The present invention has been described in terms of several embodiments solely for the purpose of illustration. Persons skilled in the art will recognize from this description that the invention is not limited to the embodiments described, but may be practiced with modifications and alterations limited only by the spirit and scope of the appended claims. For example, different materials can be chosen, different dimensions can be chosen, etc.

What is claimed is:

1. A semiconductor diode laser with a thermal sensor control, comprising:
    (a) a heat sink;
    (b) a diode-laser structure including a substrate, a plurality of epi-layers in which an active layer is contained, the substrate being attached to one of the plurality of epi-layers, a first contact electrically coupled to the substrate and a second contact electrically coupled to one other of the plurality of epi-layers, the diode-laser structure being thermally coupled to said heat sink on the epi-layer side of the diode-laser structure;
    (c) a thermal sensor thermally coupled to said diode-laser structure, said heat sink being separated from said thermal sensor by a first distance, said heat sink being separated from the active layer by a second distance that is less than the first distance, wherein said thermal sensor is directly connected to one of the first and the second contacts electrically coupled to the substrate.

2. A semiconductor diode laser with a thermal sensor control, comprising:
    (a) a heat sink;
    (b) a diode-laser structure including a substrate, a plurality of epi-layers in which an active layer is contained, the substrate being attached to one of the plurality of epi-layers, a first contact electrically coupled to the substrate and a second contact electrically coupled to one other of the plurality of epi-layers, the diode-laser structure being thermally coupled to said heat sink on the epi-layer side of the diode-laser structure;
    (c) a thermal sensor thermally coupled to said diode-laser structure, said heat sink being separated from said thermal sensor by a first distance, said heat sink being separated from the active layer by a second distance that is less than the first distance, wherein said thermal sensor is directly connected to the substrate.

3. A semiconductor diode laser with a thermal sensor control, comprising:
    (a) a heat sink;
    (b) a diode-laser structure including a substrate, a plurality of epi-layers including an active layer, the substrate being attached to one of the plurality of epi-layers, a first contact electrically coupled to the substrate and a second contact electrically coupled to one other of the plurality of epi-layers, the diode-laser structure being thermally coupled to said heat sink on the substrate side of the diode-laser structure;
    (c) a thermal sensor thermally coupled to said diode-laser structure, the substrate separated from said heat sink by a first distance, said thermal sensor separated from said heat sink by a second distance that is greater than the first distance, wherein said thermal sensor is directly connected to one of the first and the second contacts electrically coupled to the substrate.

4. A semiconductor diode laser with a thermal sensor control, comprising:
    (a) a heat sink;
    (b) a diode-laser structure including a substrate, a plurality of epi-layers including an active layer, the substrate being attached to one of the plurality of epi-layers, a first contact electrically coupled to the substrate and a second contact electrically coupled to one other of the plurality of epi-layers, the diode-laser structure being thermally coupled to said heat sink on the substrate side of the diode-laser structure;
    (c) a thermal sensor thermally coupled to said diode-laser structure, the substrate separated from said heat sink by a first distance, said thermal sensor separated from said heat sink by a second distance that is greater than the first distance, wherein said thermal sensor is directly connected to the epi-layer.

5. A semiconductor diode laser with a thermal sensor control, comprising:
    (a) a heat sink;
    (b) a diode-laser structure including an active layer, said diode-laser structure being coupled to said heat sink; and
    (c) a thermal sensor thermally coupled to said diode-laser structure, said heat sink being separated from the thermal sensor by a first distance, said heat sink being separated from the active layer by a second distance that is less than the first distance and said thermal sensor is positioned such that a projection of said thermal sensor falls onto the active region.

6. The apparatus of claim 5, wherein said diode-laser structure further includes:
    (i) a first electrical contact layer disposed on said heat sink;
    (ii) a first cladding layer disposed on said first electrical contact layer;
    (iii) a waveguide containing an active layer, said waveguide disposed on said first cladding layer;
    (iv) a second cladding layer disposed on said waveguide;
    (v) a substrate disposed on said second cladding layer; and
    (vi) a second electrical contact layer disposed on said second cladding layer.

7. The apparatus of claim 6, wherein said thermal sensor is directly attached to the second electrical contact layer.

8. The apparatus of claim 6, wherein said thermal sensor is directly attached to the substrate.

9. The apparatus of claim 6, wherein said thermal sensor is directly attached to the second cladding layer.

10. A semiconductor diode laser with thermal sensor control, comprising:
   (a) a waveguide containing an active region, said waveguide disposed between a first and second cladding layer;
   (b) a heat sink connected to said first cladding layer;
   (c) a substrate connected to said second cladding layer; and
   (d) a thermal sensor thermally coupled to said diode-laser structure, said heat sink being separated from the thermal sensor by a first distance, said heat sink being separated from the active layer by a second distance that is less than the first distance and said thermal sensor is positioned such that a projection of said thermal sensor falls onto the active region.

11. The apparatus of claim 10, wherein said thermal sensor is directly coupled to an electrical contact, the electrical contact being directly coupled to said substrate.

12. The apparatus of claim 10, wherein said thermal sensor is directly coupled to said substrate.

13. The apparatus of claim 10, wherein said thermal sensor is directly coupled to said second cladding layer.

14. A semiconductor diode laser with a thermal sensor control, comprising:
   (a) a heat sink;
   (b) a diode-laser structure, the diode-laser structure being thermally coupled to said heat sink; and
   (c) a thermal sensor thermally coupled to said diode-laser structure in a place where the temperature gradient across the semiconductor diode laser is close to zero.

* * * * *